US011309288B2

(12) United States Patent
Yang

(10) Patent No.: US 11,309,288 B2
(45) Date of Patent: Apr. 19, 2022

(54) ELECTRONIC SYSTEM, DIE ASSEMBLY AND DEVICE DIE

(71) Applicant: NANYA TECHNOLOGY CORPORATION, New Taipei (TW)

(72) Inventor: Wu-Der Yang, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 16/843,411

(22) Filed: Apr. 8, 2020

(65) Prior Publication Data

US 2021/0320084 A1 Oct. 14, 2021

(51) Int. Cl.
*H01L 25/065* (2006.01)
*H01L 23/00* (2006.01)

(52) U.S. Cl.
CPC .......... *H01L 25/0657* (2013.01); *H01L 24/05* (2013.01); *H01L 24/13* (2013.01); *H01L 24/29* (2013.01); *H01L 24/45* (2013.01)

(58) Field of Classification Search
CPC ..... H01L 25/0657; H01L 24/05; H01L 24/13; H01L 24/29; H01L 24/45; H01L 21/4853; H01L 2224/04105; H01L 2224/73207; H01L 2224/48227; H01L 24/16; H01L 2224/12105
See application file for complete search history.

(56) References Cited

U.S. PATENT DOCUMENTS

| 10,991,648 | B1 * | 4/2021 | Yang | H01L 23/3121 |
| 2012/0025298 | A1 * | 2/2012 | Ho | H01L 25/0657 257/329 |
| 2012/0043671 | A1 | 2/2012 | Nishiyama et al. | |
| 2015/0116968 | A1 * | 4/2015 | Yamada | H01L 23/49822 361/767 |

FOREIGN PATENT DOCUMENTS

| CN | 104347538 A | 2/2015 |
| EP | 0355955 A2 | 2/1990 |
| TW | 200814285 A | 3/2008 |

* cited by examiner

*Primary Examiner* — Douglas W Owens
(74) *Attorney, Agent, or Firm* — Muncy, Geissler, Olds & Lowe, P.C.

(57) ABSTRACT

The present disclosure provides a device die, a die assembly and an electronic system. The device die includes a package and a plurality of transfer pads disposed on a functional surface of the package. The transfer pads are divided into a plurality of segments electrically isolated from each other. In an adjacent pair of transfer pads, there is only one electrical connection between the transfer pads, comprising one segment in one transfer pad electrically connected to one segment in the other transfer pad. The die assembly includes a pair of device dies stacked in a stepped configuration. The electronic system includes a supporting member having at least one metallic layer, and a plurality of device dies disposed on the supporting member and mechanically and electrically coupled to the metallic layer by a plurality of conductive strings.

18 Claims, 13 Drawing Sheets

ELECTRONIC SYSTEM, DIE ASSEMBLY AND DEVICE DIE

TECHNICAL FIELD

The present disclosure relates to a device die, a die assembly and an electronic system, and more particularly, to a device die having an interconnection structure in which wiring capacitance is effectively reduced, a three-dimensional (3D) die assembly including the device die to improve signal transmission speed, and an electronic device including the die assembly.

DISCUSSION OF THE BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, or in other types of packaging, for example.

The semiconductor industry continues to improve the integration density of various electronic components (e.g., transistors, diodes, resistors, capacitors, etc.) by continual reductions in minimum feature size, which allow more components to be integrated into a given area. These smaller electronic components also require smaller packages that utilize less area than packages of the past, in some applications.

Three-dimensional integrated circuits (3DICs) are a recent development in semiconductor packaging in which multiple semiconductor dies are stacked upon one another, such as package-on-package (PoP) and system-in-package (SiP) packaging techniques. 3DICs provide improved integration density and other advantages, such as faster speeds and greater bandwidth, because of the decreased length of interconnects between the stacked dies, as examples. However, there are many challenges related to 3DICs.

This Discussion of the Background section is provided for background information only. The statements in this Discussion of the Background are not an admission that the subject matter disclosed in this Discussion of the Background section constitute prior art to the present disclosure, and no part of this Discussion of the Background section may be used as an admission that any part of this application, including this Discussion of the Background section, constitutes prior art to the present disclosure.

SUMMARY

One aspect of the present disclosure provides a device die. The device die comprises a package, a pair of transfer pads, and at least one conductive trace. The package has a functional surface. The transfer pads are disposed on the functional surface of the package. The transfer pads are divided into a plurality of segments electrically isolated from each other. The conductive trace is disposed on the functional surface to mechanical and electrical connect one segment in one transfer pad to one segment in the other transfer pad.

In some embodiments, the transfer pad includes complimentary-shaped protrusion and recess segments that mate with one another.

In some embodiments, the pair of transfer pads comprises a first transfer pad and a second transfer pad disposed on the functional surface of the package, wherein the first transfer pad includes a first concave segment and a first convex segment electrically isolated from the first concave segment, and the second transfer pad includes a second concave segment and a second convex segment electrically isolated from the second concave segment. The conductive trace mechanical and electrically connect the first concave segment in the first transfer pad to the second convex segment in the second transfer pad.

In some embodiments, the segments of the transfer pads have a same area.

In some embodiments, the device die further includes at least one contact pad disposed on the functional surface and located close to one edge of the package, wherein the transfer pad are aligned with the contact pads.

Another aspect of the present disclosure provides a die assembly. The die assembly includes a pair of device dies stacked in a stepped configuration. At least one of the device dies comprises a package, a pair of transfer pads and at least one conductive trace. The package has a functional surface. The transfer pads are disposed on the functional surface of the package. The transfer pads are divided into a plurality of segments electrically isolated from each other. The conductive trace is disposed on the functional surface to mechanical and electrical connect one segment in one transfer pad to one segment in the other transfer pad. The device dies are mechanically and electrically coupled to each other by an interconnect comprising a wire attached to the segment of one of the transfer pads in two of the device dies by ball bonding.

In some embodiments, the transfer pad comprises complimentary-shaped protrusion and recess segments that mate with one another.

In some embodiments, the pair of transfer pads comprises a first transfer pad and a second transfer pad disposed on the functional surface of the package, wherein the first transfer pad includes a first concave segment and a first convex segment electrically isolated from the first concave segment, and the second transfer pad includes a second concave segment and a second convex segment electrically isolated from the second concave segment. The conductive trace mechanical and electrically connect the first concave segment in the first transfer pad to the second convex segment in the second transfer pad.

In some embodiments, the segments of all the transfer pads have a same area.

In some embodiments, at least one device die further comprises at least one contact pads disposed on the functional surface and located close to one edge of the package, wherein the transfer pads are aligned with the contact pad.

In some embodiments, the device dies are arranged in a stepped configuration.

Another aspect of the present disclosure provides an electronic system. The electronic system includes a supporting member and a plurality of device dies disposed on the supporting member. The supporting member includes at least one metallic layer. The plurality of device dies are disposed on the supporting member and electrically coupled to the metallic layer. The at least one device die includes a package, a pair of transfer pads, and at least one conductive trace. The package has a functional surface. The transfer pads are disposed on the functional surface of the package.

The transfer pads are divided into a plurality of segments electrically isolated from each other. The conductive trace is disposed on the functional surface to mechanical and electrical connect one segment in one transfer pad to one segment in the other transfer pad. The device dies are mechanically and electrically coupled to each other by interconnects comprising a wire attached to one of the transfer pads in two of the device dies by ball bonding.

In some embodiments, a conductive string is attached to the contact pad and the metallic layer by stitch bonding.

In some embodiments, the transfer pad comprises complimentary-shaped protrusion and recess segments that mate with one another.

In some embodiments, the pair of transfer pads comprises a first transfer pad and a second transfer pad disposed on the functional surface of the package, wherein the first transfer pad includes a first concave segment and a first convex segment electrically isolated from the first concave segment, and the second transfer pad includes a second concave segment and a second convex segment electrically isolated from the second concave segment. The conductive trace mechanical and electrically connect the first concave segment in the first transfer pad to the second convex segment in the second transfer pad.

In some embodiments, the segments of all the transfer pads have a same area.

In some embodiments, the device die further includes at least one contact pads disposed on the functional surface and located close to one edge of the package, wherein the transfer pads are aligned with the contact pad.

In some embodiments, one of the device dies is mechanically and electrically coupled to the supporting member by a conductive string in contact with the metallic layer and the contact pad.

With the above-mentioned configurations of the device die having the transfer pad separated into the plurality of segments, the wiring capacitance of the die assembly including two or more device dies can be effectively reduced to improve signal transmission speed.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be understood to be coupled to the figures' reference numbers, which refer to similar elements throughout the description.

DETAILED DESCRIPTION

Figure 1:
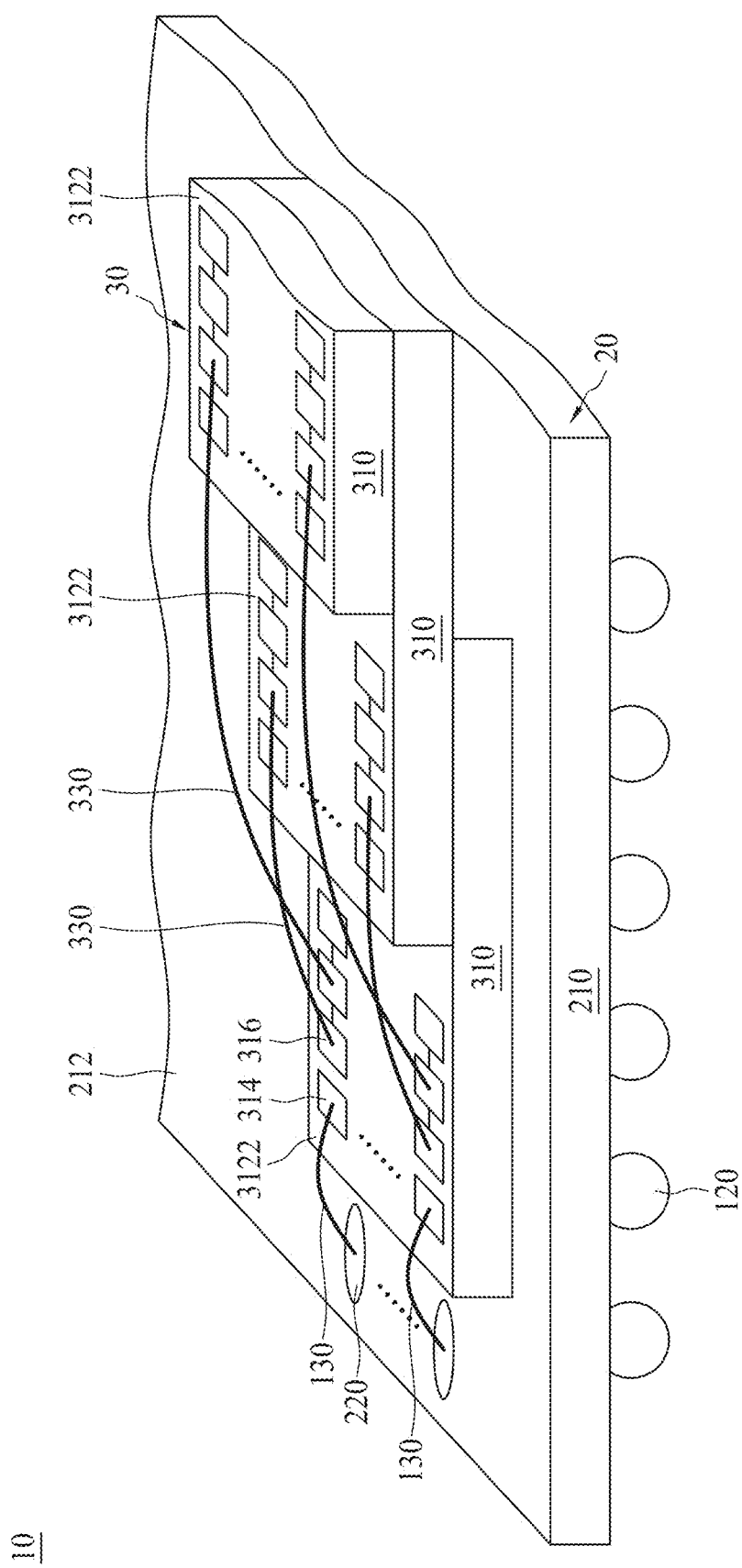
FIG. 1 is a perspective view of an electronic system in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another element, component, region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limiting to the present inventive concept. As used herein, the singular forms "a," "an" and "the" are intended to include the plural forms as well, unless the context clearly indicates otherwise. It shall be understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

Figure 2:
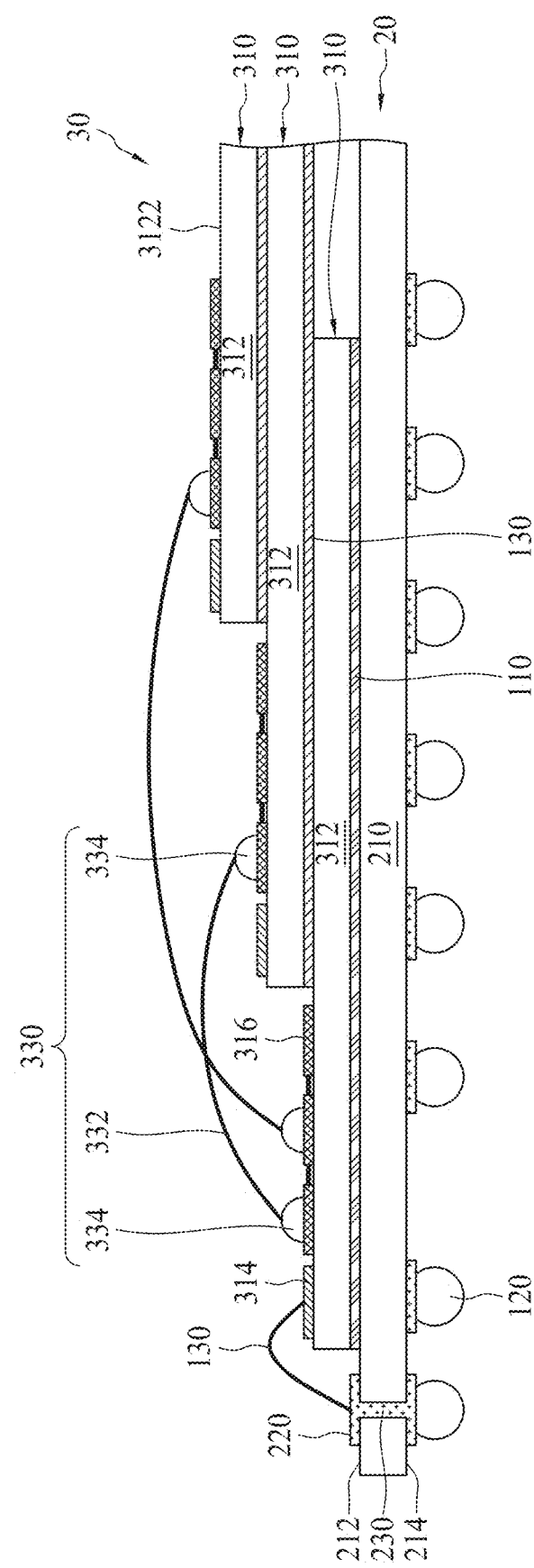
FIG. 2 is a cross-sectional view of the electronic system in accordance with some embodiments of the present disclosure.

FIG. 1 is a perspective view of an electronic system 10 in accordance with some embodiments of the present disclosure, and FIG. 2 is a cross-sectional view of the electronic system 10 in accordance with some embodiments of the present disclosure. Referring to FIGS. 1 and 2, the electronic system 10 includes a supporting member 20 and a die assembly 30 disposed on the supporting member 20. The die assembly 30 can include a dynamic random access memory (DRAM) module and is electrically connected to the supporting member 20 by wire bonding. In some embodiments, the die assembly 30 may be affixed to the supporting member 20 using an adhesive layer 110, which can be made of, for example, a double-sided adhesive polyimide tape, for greater reliability.

The supporting member 20 includes a substrate 210 having a front surface 212 and a back surface 214 opposite to the front surface 212, and a plurality of metallic layers 220 disposed on the front surface 212 and the back surface 214. The metallic layers 220 are patterned to provide appropriate circuitry and connected by way of conductive vias 230. The supporting member 20 can be a double-sided printed circuit board (PCB). The adhesive layer 110 is provided on the front surface 212 of the substrate 210 to adhere the supporting member 20 to the die assembly 30.

The substrate 210 can be made of electrically-insulative material such as BT resin or FR4 epoxy/glass. Alternatively, a polyimide-based substrate or ceramic substrate may be used. The metallic layers 220 can be gold-plated layers, copper-plated layers, or aluminum-plated layers; the conductive vias 230 may be copper conductors. In some embodiments, solder bumps 120 are reflowed onto the metallic layer 220 on the back surface 214 of the substrate 210 to provide interconnection to an external circuitry, for example, a mother board, of a final product, such as a computer.

The die assembly 30 includes a plurality of device dies 310 stacked in a stepped configuration. More particularly, for providing connectivity to the external circuitry and/or another device die 310, a region of each device die 310 is exposed to the device die 310 stacked thereon. Adhesive layers 130 can be provided between adjacent device dies 310 of the die assembly 30. The adhesive layers 130 are typically referred to as the die attach epoxy. It should be noted that the adhesive layers 110 and 130 can be made of the same material to reduce cost. That is, in some embodiments, the adhesive layers 110 and 130 may be double-sided adhesive polyimide tapes or die attach epoxy.

The device die 310 includes a package 312 encapsulating core circuitries (not shown) associated with the device die 310, and a plurality of contact pads 314 and a plurality of transfer pads 316 disposed on a functional surface 3122 of the package 312. The functional surfaces 3122 of the packages 312 face away from the front surface 212 of the substrate 210 after the device dies 310 are assembled on the supporting member 20. That is, the device dies 310 are stacked in a front-to-back configuration. The contact pads 314 and the transfer pads 316 of one of the device dies 310 are exposed to another device die 310 stacked thereon.

The contact pads 314 and the transfer pads 316 are electrically connected to the core circuitries including memory circuitry, control circuitry, buffering circuitry, etc. The contact pads 314 can provide a way to connect the core circuitries of the device die 310 to the external circuitry, and the transfer pads 316 can provide a way to connect the core circuitries of the device die 310 to another device die 310. The contact pads 314 and the transfer pads 316 can have a metallization suitable for wire bonding.

Figure 3:
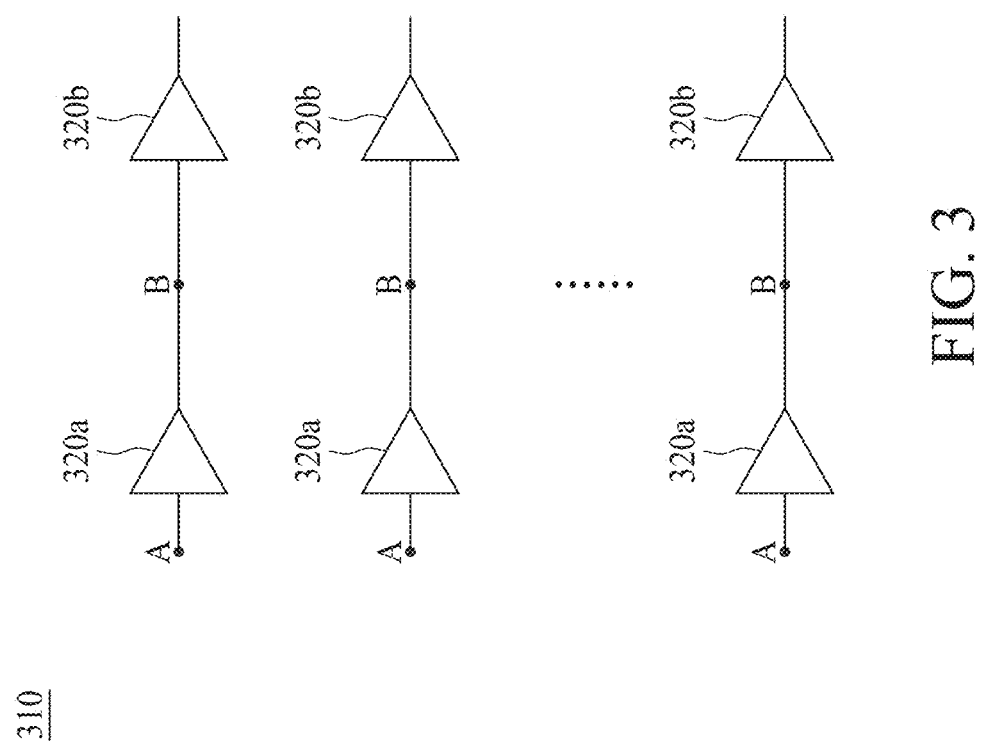
FIG. 3 is a partial circuit block diagram of core circuitries in a device die in accordance with some embodiments of the present disclosure.
Figure 4:
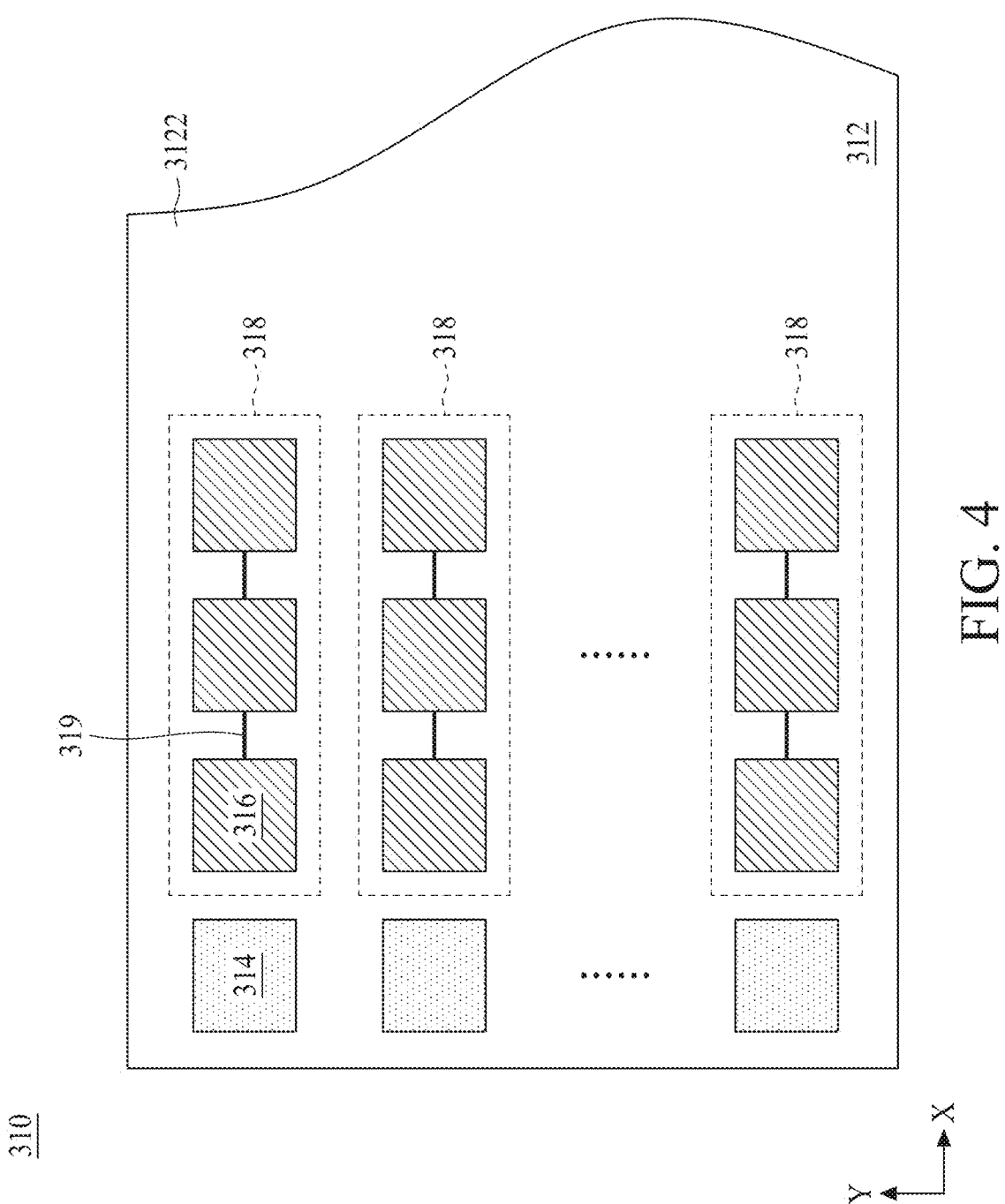
FIG. 4 is a schematic view showing a layout configuration of contact pads and transfer pads of the device die in accordance with some embodiments of the present disclosure.

FIG. 3 is a partial circuit block diagram of the core circuitries in the device die 310 in accordance with some embodiments of the present disclosure, and FIG. 4 is a schematic view showing a layout configuration of contact pads and transfer pads of the device die in accordance with some embodiments of the present disclosure. Referring to FIGS. 3 and 4, the device die 310 can includes a plurality of first input receivers 320a and a plurality of second input receivers 320b respectively connected to the first input receivers 320a in series. The contact pad 314 is electrically connected to a node A at an input of the first receiver 320a, and the transfer pad 316 is serially connected to a node B between an output of the first input receiver 320a and an input of the second input receiver 320b.

The contact pads 314 are disposed in an equidistant manner and located close to one edge of the package 312. The contact pads 314 are electrically isolated from each other. The transfer pads 316, arranged in a matrix manner, form a plurality of strings 318, respectively aligned with the contact pads 314. The transfer pads 316 in a string 318 are electrically connected in series by connection 319 placed on the functional surface 3122. More particularly, each connection 319 is employed to mechanically and electrically connect an adjacent pair of transfer pads 316. The transfer pads 316 in each string 318 are electrically isolated from the transfer pads 316 in the other strings 318.

Referring again to FIGS. 1 and 2, the electronic system 10 further includes a plurality of first conductive strings 130 employed to mechanically and electrically connect one of the metallic layers 220 on the front surface 212 of the substrate 210 to the contact pad 314 of one of the device dies 310, thereby creating an electrical path between the supporting member 20 and the die assembly 30. Accordingly, signals generated from the external device can be conducted to the die assembly 30. The conductive string 130 may be attached to the metallic layer 220 and the contact pad 314 by stitch bonding or ball bonding. In some embodiments, the conductive string 130 may be attached to the device die 310 proximal to the supporting member 20 to reduce a length, and hence the resistance, of the conductive string 130.

The die assembly 30 further includes a plurality of second conductive strings 330 employed to mechanically and electrically connect the device dies 310. More particularly, a device die 310 in connection with the supporting member 20 is electrically coupled to another device die 310 by the second conductive string 330. The second conductive string 330 can be attached to the transfer pads 316 by stitch bonding or ball bonding. In should be noted that a number of the device dies 310 stacked on one of the device dies 310 that is connected to the supporting member 20 by the second conductive strings 330 is equal to a number of the transfer pads 316 in each string 318. For example, if the device die 310 in connection with the supporting member 20 includes three transfer pads 316 in each string 318, the die assembly 30 can include four stacked device dies 310; one of which is connected to the supporting member 20 by the first conductive string 130 and connected to the other three stacked device dies 310 by the second conductive string 330.

Figure 5:
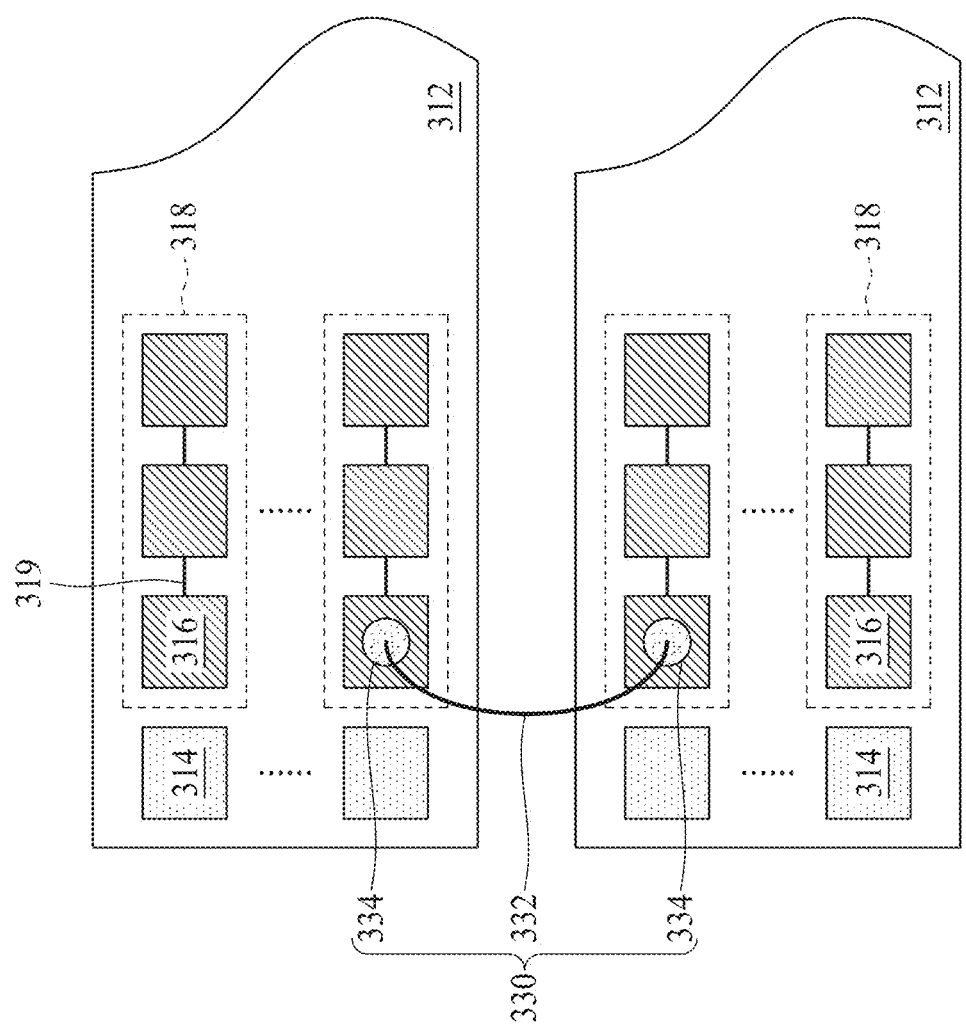
FIG. 5 is a schematic view of the device, dies in which transfer pads are mechanically and electrically connected by an interconnect in accordance with some embodiments of the present disclosure.

FIG. 5 is a schematic view of the device dies 310 in which transfer pads 316 are shown mechanically and electrically connected by the second conductive string 330 in accordance with some embodiments of the present disclosure. Referring to FIG. 5, after the second conductive string 330 is bonded to the transfer pads 316 of the pair of device dies 310 by ball bonding 334, the transfer pads 316 in the strings 318 are attached in a parallel connection. Assuming each string 318 includes three transfer pads 316 and each transfer pad 316 has a capacitance of 1 pf, then the capacitance of the transfer pads 316 in serial connection in each string 318 is 3 pf, and the capacitance of the strings 318 in different device dies 310 electrically connected in parallel is 6 pf.

Figure 6:
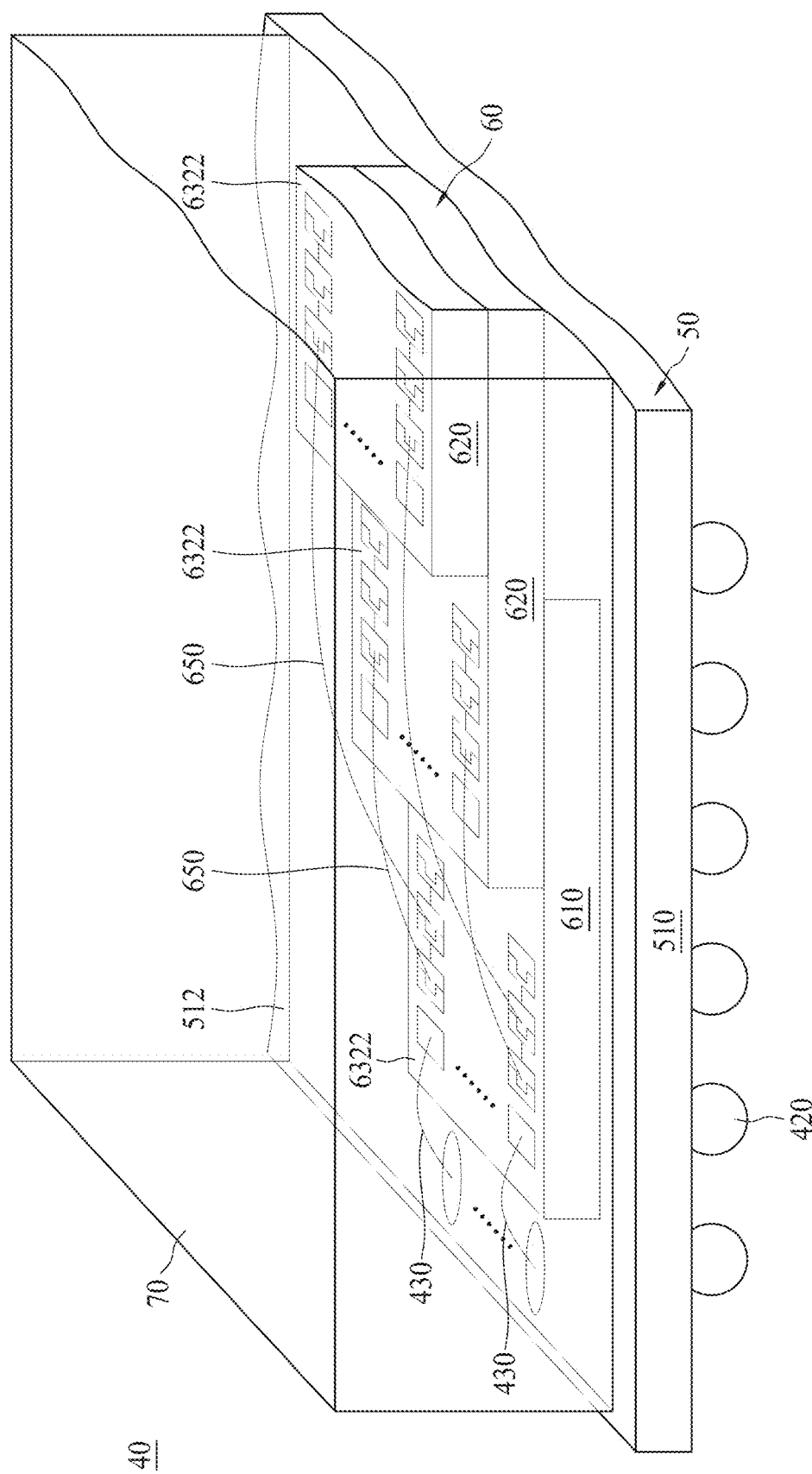
FIG. 6 is a perspective view of an electronic system in accordance with some embodiments of the present disclosure.
Figure 7:
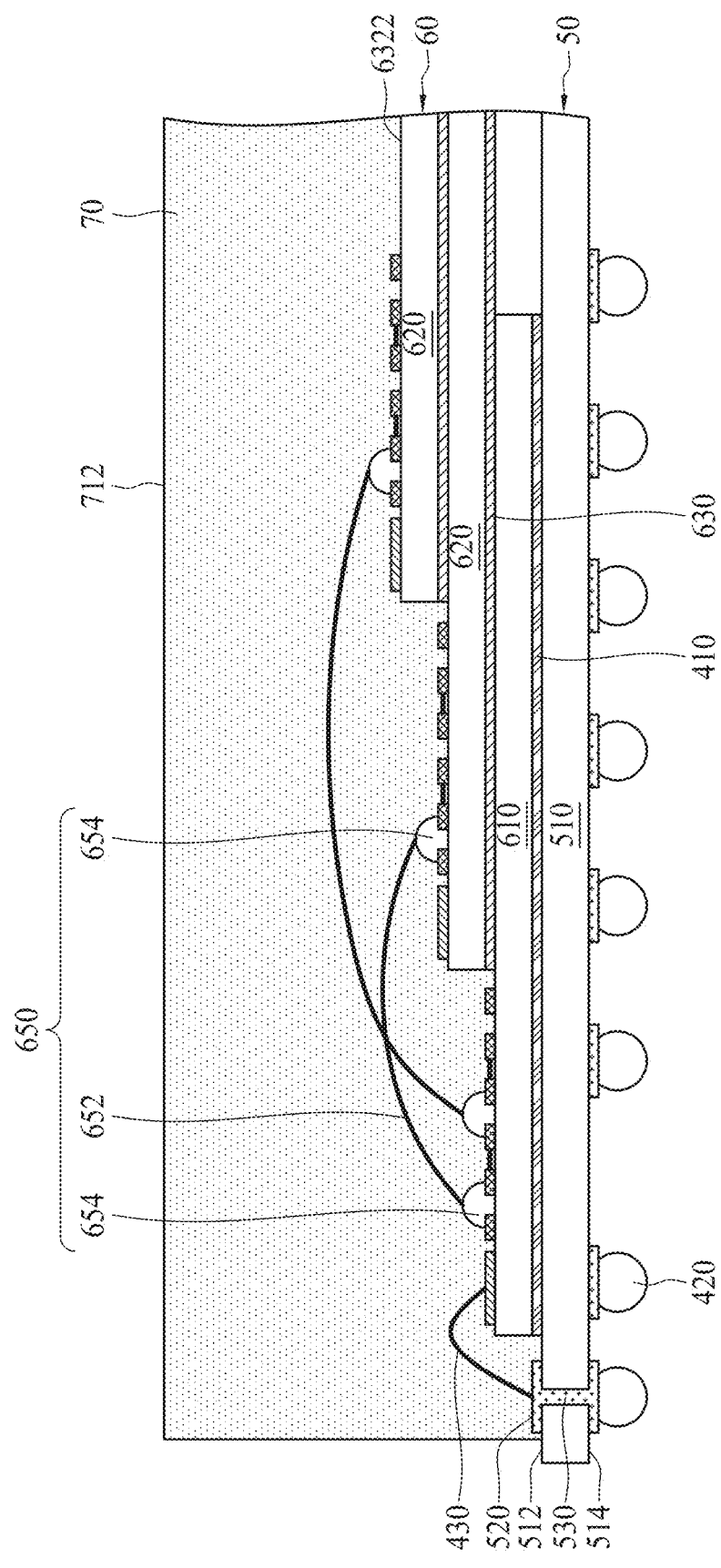
FIG. 7 is a cross-sectional view of the electronic system in accordance with some embodiments of the present disclosure.

FIG. 6 is a perspective view of an electronic system 40 in accordance with some embodiments of the present disclosure, and FIG. 7 is a cross-sectional view of the electronic system 40 in accordance with some embodiments of the present disclosure. Referring to FIGS. 6 and 7, the electronic system 40 includes a supporting member 50 and a die assembly 60 including a DRAM module placed on the supporting member 50. The attachment between the die assembly 60 and the supporting member 50 is enabled by an adhesive layer 410, which can be a paste or a resin with adhesion properties, for example. By the use of the adhesive layer 410, the die assembly 60 can be affixed on the supporting member 50, for greater reliability. The die assembly 60 is mechanically and electrically connected to the supporting member 50 by wire bonding technique including a plurality of conductive strings 430. In some embodiments, the conductive strings 430 can include gold, copper, aluminum, or an alloy of these materials.

The supporting member 50 includes a substrate 510 having a front surface 512 where the die assembly 60 is disposed and a back surface 514 opposite to the front surface 512, and a plurality of metallic layers 520 having predetermined patterns disposed on the front surface 512 and the back surface 514 respectively. A plurality of conductive vias 530 penetrating through the substrate 510 are provided to mechanically and electrically couple the metallic layer 520 on the front surface 512 to the back surface 514 of the substrate 510. In some embodiments, the supporting member 50 may further includes circuit patterns (not shown) within the substrate 510, and circuit patterns are electrically coupled to the metallic layers 520 by the conductive vias 530. In other words, the supporting member 50 can be a multi-layered PCB.

The substrate 510 can be made of electrically insulative material, the metallic layers 520 and the circuit patterns can be copper layers or gold-cladding copper layers, and the conductive vias 530 may be copper conductors. The electronic system 40 can further include a plurality of solder bumps 420 attached to the metallic layer 520 placed on the back surface 514 of the substrate 510. The solder bumps 420 serve as input/output (I/O) connections to mechanically and electrically connect the electronic system 40 to an external circuitry, for example, a mother board, of a final product, such as a computer. The formation of the solder bumps 420 includes (1) placing a solder flux (not shown) on the metallic layer 520 placed on the back surface 514 of the substrate 510, (2) disposing the solder bumps 420 on the solder flux so that the solder bumps 420 and the solder flux are in contact, and (3) reflowing the material of the solder bumps 420 and the solder flux to physically bond the solder bumps 420 to the metallic layer 520.

The master die 610 and the slave dies 620 are stacked in a stepped arrangement. In some embodiments, the master die 610 is disposed proximal to the supporting member 50 to reduce a length of conductive strings 430 mechanically and electrically coupling the supporting member 50 to the master die 610. In alternative embodiments, the master die 610 and the slave dies 620 can be arranged on the supporting member 50 in a random order. For providing connectivity to at least one external circuitry (i.e., the metallic layer 520, the master die 610 and/or the slave die 620) by wire bonding technique, a region of master and slave dies 610 and 620 is exposed to another slave die 610 stacked thereon. Adhesive layers 630 can be provided between the stacked master and slave dies 610 and 620 and between the stacked slave dies 620.

Figure 8:
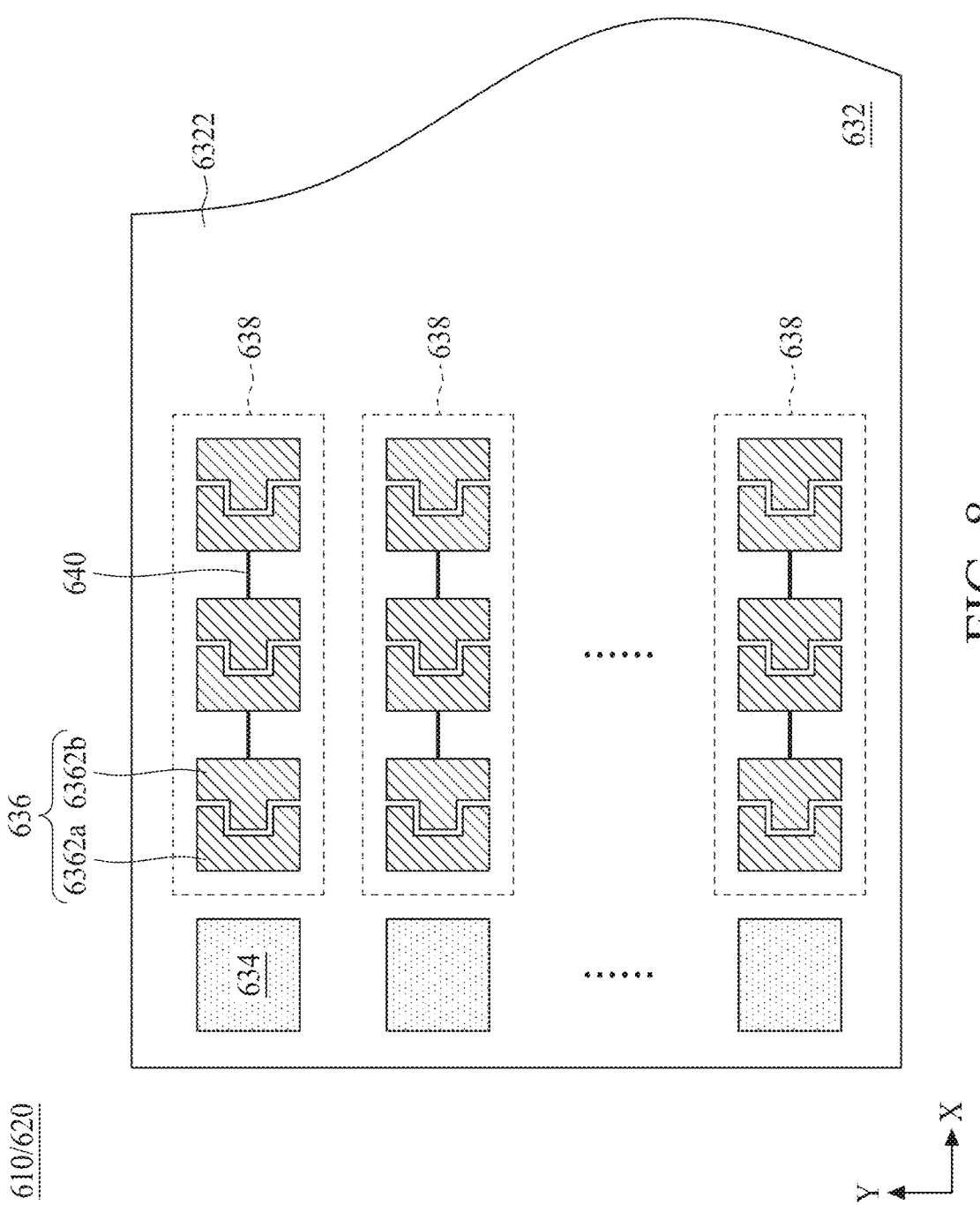
FIG. 8 is a schematic view showing a layout configuration of contact pads and transfer pads of a master die or a slave die in accordance with some embodiments of the present disclosure.

It should be noted that the master die 610 and the slave die 620 of the present disclosure can have the same layout configuration to reduce the manufacturing steps and hence cost. FIG. 8 is a schematic view showing a layout configuration of contact pads and transfer pads of the master die 610 or the slave die 620 in accordance with some embodiments of the present disclosure. Referring to FIGS. 6 to 8, the master die 610 or slave die 620, including an integrated circuit, includes a package 632 encapsulating core circuitries (not shown) associated with the master die 610 or slave die 620, and a plurality of contact pads 634 and a plurality of transfer pads 636 disposed on a functional surface 6322 of the package 632. The functional surfaces 6322 of the master die 610 or slave die 620 face away from the front surface 512 of the substrate 510 after the master die 610 and the slave die 620 are assembled on the supporting member 50.

The contact pads 634 and the transfer pads 636, placed on the region of the master and slave dies 610 and 620 exposed by the slave dies 620 stacked thereon, are electrically connected to the core circuitries including memory circuitry, control circuitry, buffering circuitry, etc. The contact pads 634 and the transfer pads 636, having a metallization suitable for wire bonding, can provide a way to connect the core circuitries of the master die 610 or slave die 620 to the external circuitry.

Referring again to FIG. 8, the contact pads 634, placed on the functional surface 6322, are arranged along an axis Y. In some embodiments, the contact pads 634 are disposed in an equidistant manner and located close to one edge of the package 632. The transfer pads 636, arranged in a matrix manner, form a plurality of strings 638 aligned with the contact pads 634 respectively. Each transfer pad 636 is divided into a plurality of segments 6362 electrically isolated from each other. In an adjacent pair of transfer pads 636 in a string 638, only two segments 6362 in different transfer pads 636 are electrically connected by a conductive trace 640. The segments 6362 of the transfer pads 636 can be electrically coupled to each other by ball bonding.

Figure 9A:
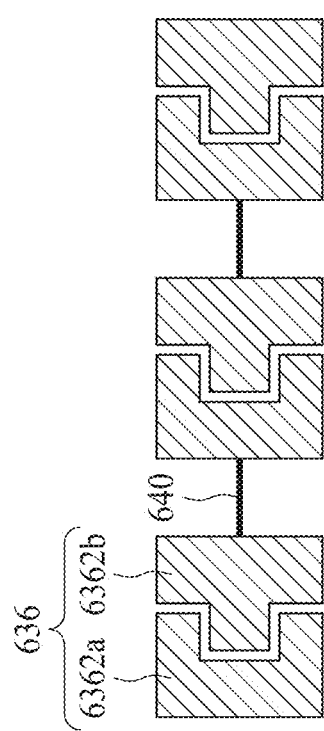
FIGS. 9A through 9D are plan views of the transfer pad in accordance with some embodiments of the present disclosure.

Referring to FIG. 9A, each of the transfer pads 636 can have a rectangular contour and is divided into a pair of complementary-shaped segments, including a concave segment 6362a and a convex segment 6362b. In an adjacent pair of the transfer pads 636, a conductive trace 640 is provided to mechanically and electrically connect the concave segment 6362a to the convex segment 6362b in a different transfer pad 636. In some embodiments, the segments 6362a and 6362b can have the same area.

Figure 9B:
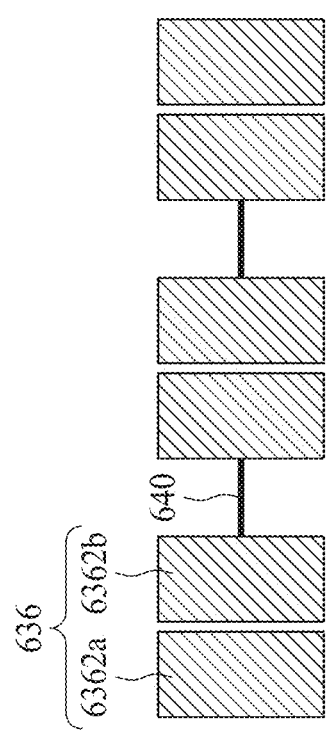

Referring to FIG. 9B, each of the transfer pads 636, having a rectangular contour, is divided into a pair of segments 6362a and 6362b having the same contour and the same area. In contrast to the transfer pads 636 shown in FIG. 9A, the transfer pads 636 having the rectangular contour shown in FIG. 9B have an advantage of easier manufacturing. However, the transfer pads 636 having the complementary-shaped segments 6362a and 6362b can increase the contact area between the segments 6362a and 6362b and the wire bonding.

Figure 9C:
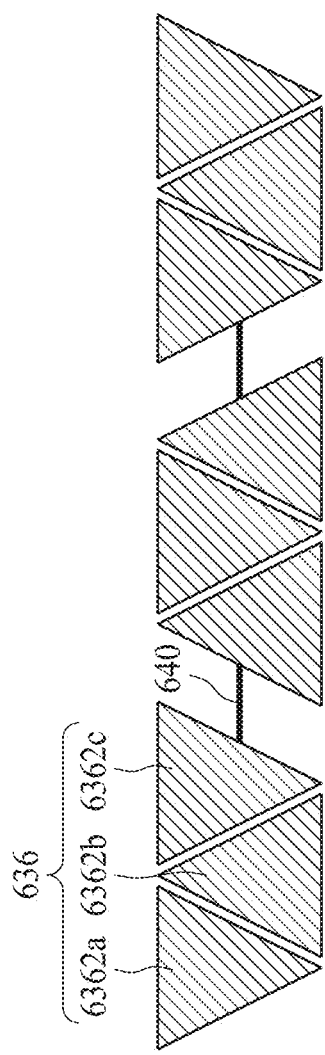

Referring to FIG. 9C, the transfer pad 636 is divided into three segments 6362a, 6362b and 6362c electrically isolated from each other. The segments 6362a, 6362b and 6362c can have a triangular contour. It should be noted that the transfer pads 636 can be divided into more than two segments electrically isolated from each other. In some embodiments, the transfer pads 636 can be patterned to form the plurality of segments 6362a, 6362b and 6362c having the predetermined contour mentioned above using lithography and etching processes.

Figure 9D:
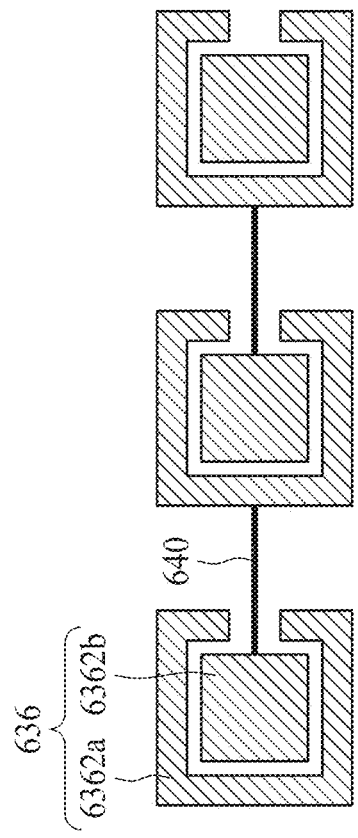

Referring to FIG. 9D, the transfer pad 636 can be divided into an external segment 6362a having a C-shaped contour and an interior segments 6362b having a rectangular contour and surrounded by the external segment 6364a. In an adjacent pair of the transfer pads 636, a conductive trace 640 is provided to mechanically and electrically connect the internal segment 6362b in one transfer pad 636 to the external segment 6362a in a different transfer pad 636. The external segments 6362a and the internal segment 6362b can have different areas.

Figure 10:
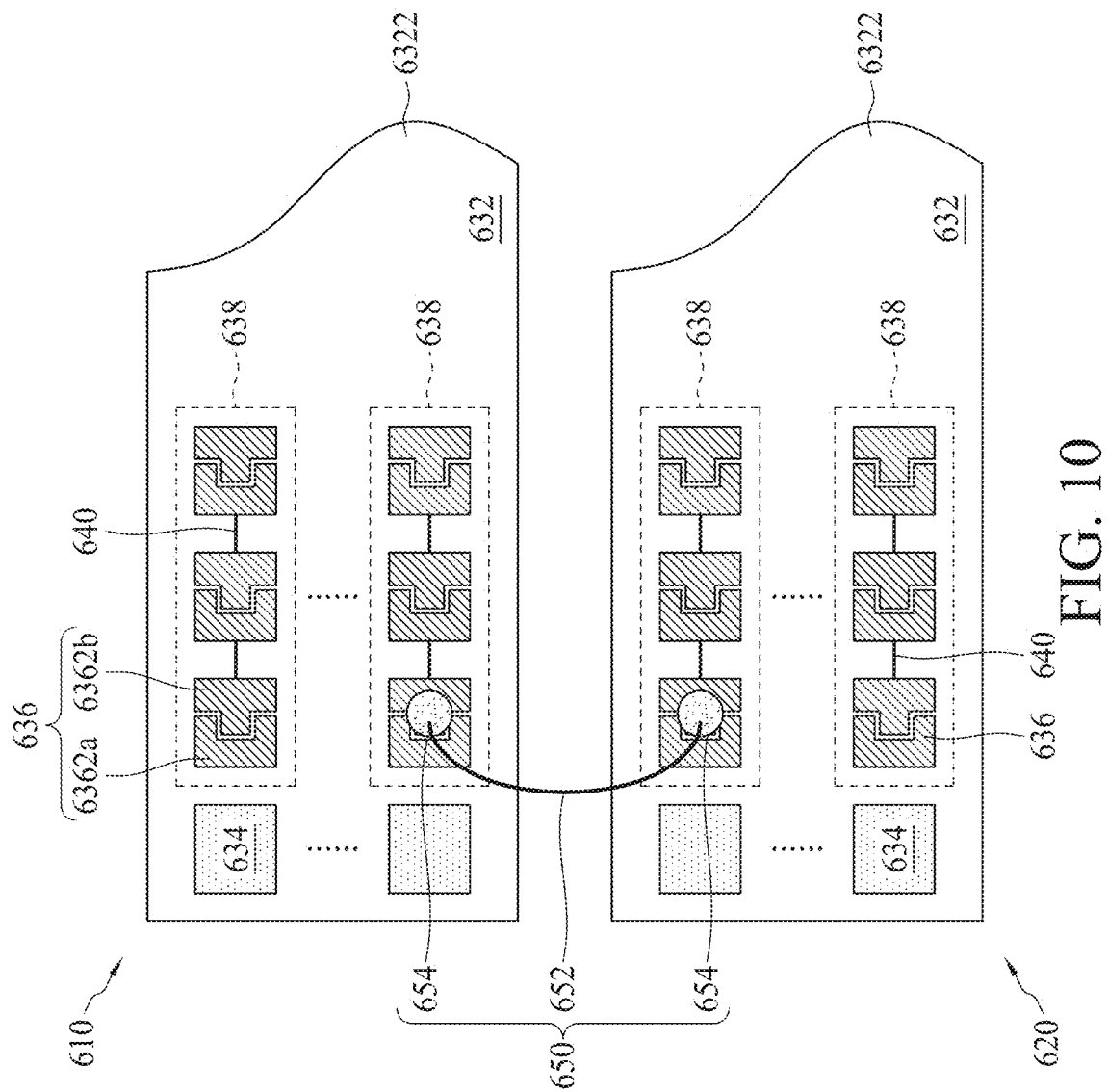
FIG. 10 is a schematic view of the master die and slave die in which transfer pads are mechanically and electrically connected by the interconnect in accordance with some embodiments of the present disclosure.

Referring again to FIGS. 6 and 7, the die assembly 60 further includes a plurality of interconnects 650 employed to mechanically and electrically connect the slave dies 620 to the master die 610. FIG. 10 is a schematic view of the master die 610 and the slave die 620, in which transfer pads 636 are mechanically and electrically connected by the interconnects 650 in accordance with some embodiments of the present disclosure. Referring to FIG. 10, the interconnect 650 includes a wire 652 attached to one of the transfer pads 636 of the master die 610 and one of the transfer pads 636 of one of the slave dies 620 by ball bonding 654. It should be noted that a number of the slave dies 620 to which the master dies 610 can be mechanically and electrically connected by the interconnect 650 is equal to a number of the transfer pads 636 in each string 638. For example, the die assembly 60 can include three slave dies 620 if the master die 610 includes three transfer pads 636 in each string 638.

Figure 11:
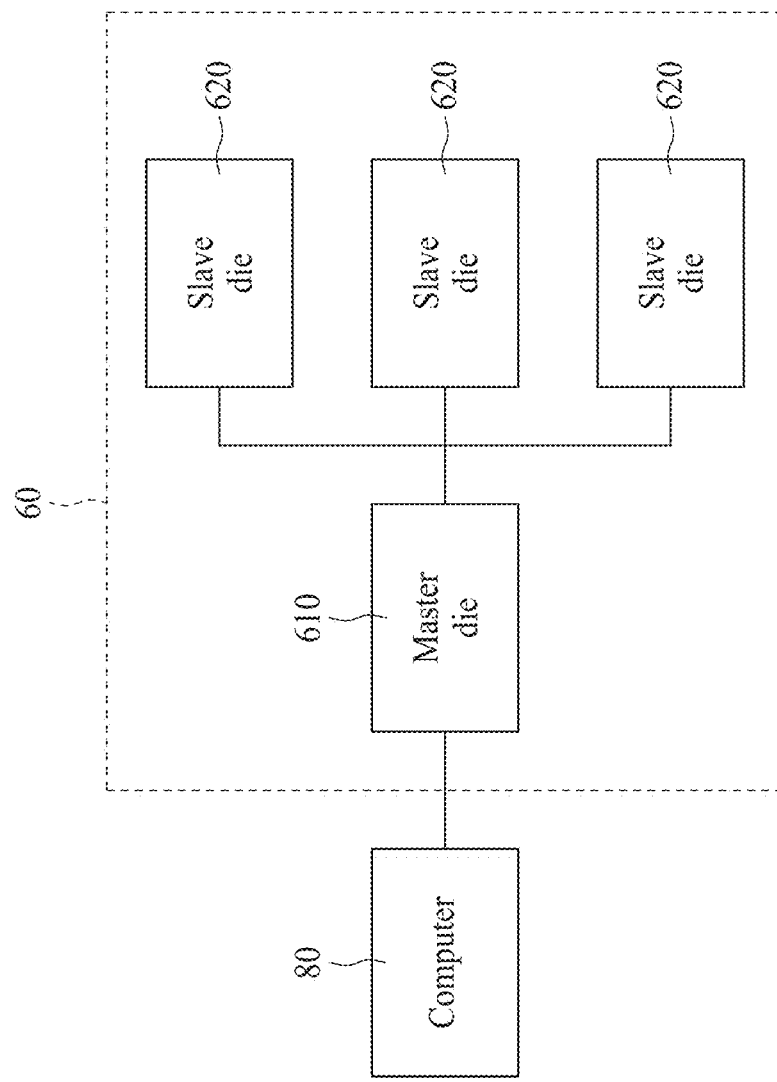
FIGS. 11 and 12 are circuit block diagrams of a die assembly in accordance with some embodiments of the present disclosure.
Figure 12:
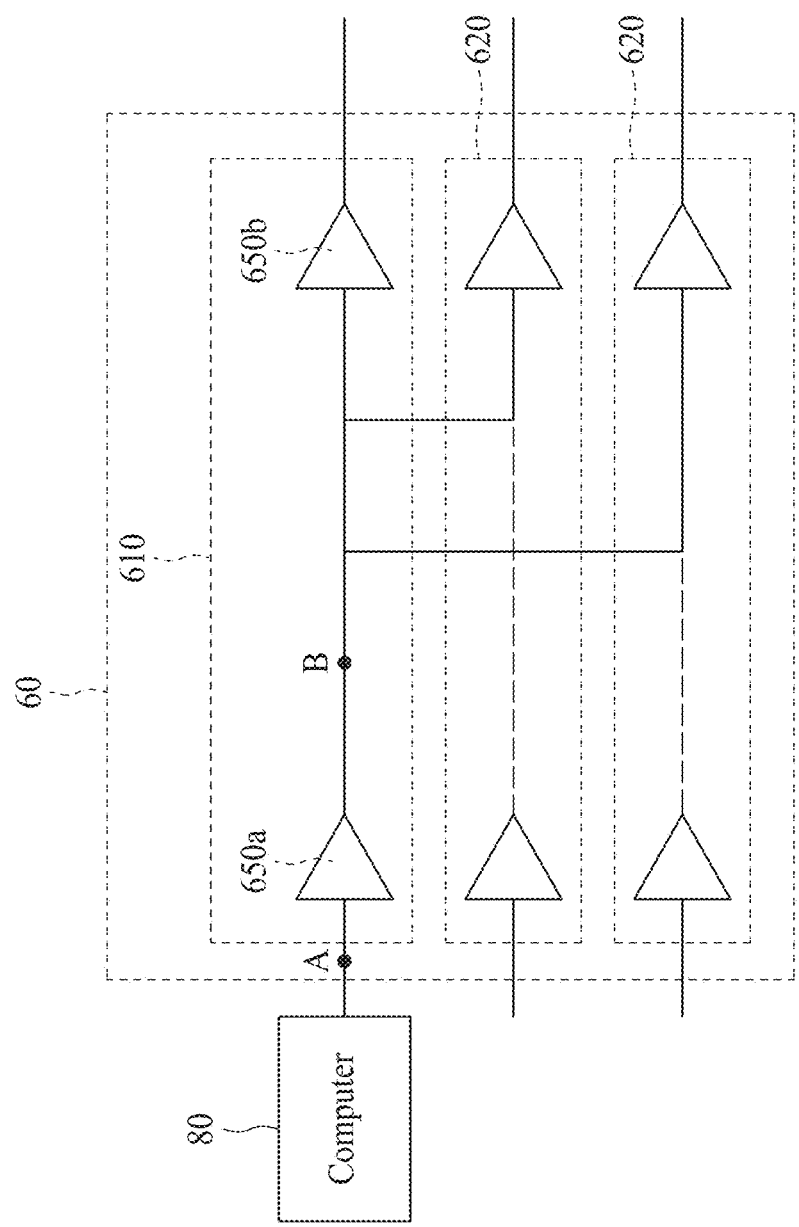

FIGS. 11 and 12 are circuit block diagrams of the die assembly 60 in accordance with some embodiments of the present disclosure. Referring to FIGS. 6, 11 and 12, the die assembly 60 includes the master and slave dies 610 and 620 stacked in a front-to-back configuration. The master die 610 and the slave die 620 can include at least one first input receiver 650a and at least one second input receiver 650b electrically connected to the first input receivers 320a in series. The contact pads 634 are electrically connected to a node A at an input of the first receiver 650a, and the transfer pads 636 are electrically connected in series to a node B between an output of the first input receiver 650a and an input of the second input receiver 650b.

The master die 610 is electrically coupled to the supporting member 50 by the conductive strings 430 bonded to the metallic layer 520 and the contact pads 634, so that after the electronic system 40 is mounted on the mother board provided with a computer 80, an interconnection can be created between the die assembly 60 and the computer 80 providing signals for controlling operations of the die assembly 60 through the solder bumps 420, the metallic layer 520 on the back surface 514 of the substrate 510, the conductive via 530, the metallic layer 520 on the front surface 512 of the substrate 510, and the conductive strings 430.

Referring again to FIGS. 10 through 12, the master die 610 is electrically coupled to each of the slave dies 620 by the interconnect 650 including the wire 652 bonded to the transfer pads 636 of the master die 610 and the slave die 620 by ball bonding 654. Therefore, the second input receivers 650b of the slave dies 620 are connected to the node B. In other words, the slave dies 620 of the die assembly 60 are electrically connected in parallel. The signals provided by the computer 80 and conducted to the first input receiver 650a of the master die 610 are then transmitted to the second input receivers 650b of the master die 610 and the slave dies 620.

Referring again to FIG. 10, assuming each string 638 includes three transfer pads 636, each transfer pad 636 has a capacitance of 1 pf, and each transfer pad 636 is divided into two separated segments 6362 having the same area, then a capacitance of each segment 6362 is 0.5 pf. Accordingly, a capacitance of the string 638 including only one ball bonding 654 to mechanically and electrically connect the separated segments 6362 of one of the transfer pads 636 is 1.5 pf, and a capacitance of the string 638 including two ball bondings 654 to mechanically and electrically connect the separated segments 6362 of two of the transfer pads 636 is 2.5 pf. That is, the master die 610 or the slave die 620 including the transfer pads 636 divided into the two or more segments 6362 can reduce the (interconnection) capacitance in each string 638 if a number of the ball bondings 654 to mechanically and electrically connect the separated segments 6362 in the string 638 is less than a number of the transfer pads 636 in the string 638.

In addition, if the wire 652 is mechanically and electrically connected between one of the transfer pads 636 of the master die 610 and one of the transfer pads 636 of the slave die 620 by ball bonding 654 mounted to the separated segments 6362 of the transfer pads 636, then a capacitance of the strings 638 in the master die 610 and the slave die 620 electrically connected with each other is 3 pf, which is less than the capacitance of the strings in the configuration in which the transfer pads are not separated.

Referring again to FIGS. 6 and 7, the electronic device 40 further includes a sealant 70 covering the master die 610, the slave dies 620 and the interconnects 650 for mechanical and environmental protection. In some embodiments, the sealant 70 further covers the conductive string 430 and the metallic layer 520 on the front surface 512 of the substrate 510. In some embodiments, a periphery of the supporting member 50 is exposed through the sealant 70. In some embodiments, the sealant 70 may have a flat top surface 712. In some embodiments, the sealant 70 may include epoxy-based resin, polyimide-based resin, polyester-based resin or polyacrylate-based polymer resin.

In some embodiments, the sealant 70 may be transparent or opaque. When the sealant 70 is opaque, black color is preferred. The black color radiates the most heat and is most effective for dissipating heat from the master and slave dies 610 and 620 to the interconnect 650, the conductive string 430 and the metallic layer 520. In some embodiments, the black color may be formed by the addition of toner particles (not shown). In some embodiments, the toner particles, including carbon, for example, may be additionally applied within the sealant 70 to readily transfer heat generated from the master and slave die 610 and 620 to the supporting member 50, and the thermal dissipating property of the electronic system 40 is thus improved. By placing the toner particles in the sealant 70, the curing time of the sealant 70 can be reduced. In some embodiments, the sealant 70 may contain a filler material (not shown) for reinforcing a mechanical characteristic. Specifically, the filler material functions to prevent the mechanical characteristics of the sealant 70 from deteriorating during the bonding of the electronic system 40. In some embodiments, the filler material may include silicon oxide, silicon dioxide, titanium dioxide or aluminum oxide.

In conclusion, with the configuration of the device die (i.e., the master die 610 and the slave die 620 described above) with transfer pads 636 divided into a plurality of segments 6362*a* and 6362*b* and electrically isolated from each other, the wiring capacitance of the die assembly 60 including two or more device dies can be effectively reduced to improve signal transmission speed.

One aspect of the present disclosure provides a device die. The device die comprises a package, a pair of transfer pad, and at least one conductive trace. The package has a functional surface. The transfer pads are disposed on the functional surface of the package. The transfer pads are divided into a plurality of segments electrically isolated from each other. The conductive trace is disposed on the functional surface and employed to mechanically and electrically connect one segment in one transfer pad to one segment in the other transfer pad.

One aspect of the present disclosure provides a die assembly. The die assembly comprises a pair of device dies stacked in a stepped configuration. At least one of the device dies comprises a package, a pair of transfer pads, and at least one conductive trace. The package has a functional surface. The transfer pads are disposed on the functional surface of the package. The transfer pads are divided into a plurality of segments electrically isolated from each other. The conductive trace is disposed on the functional surface of the package to mechanical and electrical connect one segment in one transfer pad to one segment in the other transfer pad. The device dies are mechanically and electrically coupled to each other by an interconnect comprising a wire attached to the segment of one of the transfer pads in two of the device dies by ball bonding.

One aspect of the present disclosure provides an electronic system. The electronic system includes a supporting member and a plurality of device dies disposed on the supporting member. The supporting member comprises a metallic layer, and the plurality of device dies are disposed on the supporting member and are mechanically and electrically coupled to the metallic layer by at least one conductive string. The device die comprises a package, a pair of transfer pads, and at least one conductive trace. The package has a functional surface. The transfer pads are disposed on the functional surface of the package. The transfer pads are divided into a plurality of segments electrically isolated from each other. The conductive trace is disposed on the functional surface of the package to mechanical and electrical connect one segment in one transfer pad to one segment in the other transfer pad. The device dies are mechanically and electrically coupled to each other by interconnects comprising a wire attached to the segment of one of the transfer pads in two of the device dies by ball bonding.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods and steps.

What is claimed is:

1. A device die, comprising:
   a package having a functional surface; and
   a pair of transfer pads disposed on the functional surface, wherein the transfer pads are divided into a plurality of segments electrically isolated from each other; and
   at least one conductive trace disposed on the functional surface to mechanically and electrically connect one segment in one transfer pad to one segment in another transfer pad.

2. The device die of claim 1, wherein the transfer pad comprises complimentary-shaped segments that mate with one another.

3. The device die of claim 1, wherein each of the pair of transfer pads comprises a cut-out segment and an interlocking segment electrically isolated from the cut-out segment; the at least conductive trace electrically connects the pair of transfer pads, wherein the cut-out segment in one of the pair of transfer pads is electrically connected to the interlocking segment in another of the pair of transfer pads through the at least one conductive trace.

4. The device die of claim 1, wherein the areas of the segments of all the transfer pads are the same.

5. The device die of claim 1, further comprising at least one contact pad disposed on the functional surface and located close to one edge of the package, wherein the transfer pads are aligned with the contact pad.

6. A die assembly, comprising:
   a pair of device dies stacked in a stepped configuration, wherein at least one of the device dies comprises:
     a package having a functional surface;
     a pair of transfer pads disposed on the functional surface of the package, wherein the transfer pads are divided into a plurality of segments electrically isolated from each other; and
     at least one conductive trace disposed on the functional surface of the package to mechanically and electrically connect one segment in one transfer pad to one segment in another transfer pad,
   wherein the device dies are mechanically and electrically coupled to each other by an interconnect comprising a wire attached to the segment of one of the transfer pads in two of the device dies by ball bonding.

7. The die assembly of claim 6, wherein the transfer pad comprises complimentary-shaped segments that mate with one another.

8. The die assembly of claim 6, wherein each of the pair of transfer pads comprises a cut-out segment and an interlocking segment electrically isolated from the cut-out segment; the conductive trace electrically connects the pair of transfer pads, wherein the cut-out segment in one of the pair of transfer pads is electrically connected to the interlocking segment in another of the pair of transfer pads through the at least one conductive trace.

9. The die assembly of claim 6, wherein the areas of the segments of all of the transfer pads are the same.

10. The die assembly of claim 6, wherein at least one of the device dies further comprises at least one contact pad disposed on the functional surface and located close to one edge of the package, wherein the transfer pads are aligned with the contact pad.

11. The die assembly of claim 6, wherein the device dies are arranged in a stepped configuration.

12. An electronic system, comprising:
a supporting member comprising at least one metallic layer; and
a plurality of device dies disposed on the supporting member and mechanically and electrically coupled to the metallic layer by a plurality of conductive strings, wherein at least one device die comprises:
a package having a functional surface; and
a pair of transfer pads disposed on the functional surface of the package, wherein the transfer pads are divided into a plurality of segments electrically isolated from each other; and
at least one conductive trace disposed on the functional surface of the package to mechanically and electrically connect one segment in one transfer pad to one segment in another transfer pad,
wherein the device dies are mechanically and electrically coupled to each other by interconnects comprising a wire attached to one of the transfer pads in two of the device dies by ball bonding.

13. The electronic system of claim 12, wherein the conductive string is attached to the contact pad and the metallic layer by stitch bonding.

14. The electronic system of claim 12, wherein the transfer pad comprises complimentary-shaped segments that mate with one another.

15. The electronic system of claim 12, wherein each of the pair of transfer pads comprises a cut-out segment and an interlocking segment electrically isolated from the cut-out segment; the conductive trace electrically connects the pair of transfer pads, wherein the cut-out segment in one of the pair of transfer pads is electrically connected to the interlocking segment in another of the pair of transfer pads through the at least one conductive trace.

16. The electronic system of claim 12, wherein the areas of the segments of all the transfer pads are the same.

17. The electronic system of claim 12, further comprising at least one contact pad disposed on the functional surface and located close to one edge of the package, wherein the transfer pads are aligned with the contact pad.

18. The electronic system of claim 17, wherein one of the device dies is mechanically and electrically coupled to the supporting member by the conductive strings in contact with the metallic layer and the contact pad.

* * * * *